(12) United States Patent
Bian

(10) Patent No.: US 9,754,879 B2
(45) Date of Patent: Sep. 5, 2017

(54) INTEGRATED CIRCUITRY

(71) Applicant: Micron Technology, Inc., Boise, ID (US)

(72) Inventor: Zailong Bian, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 4 days.

(21) Appl. No.: 14/992,280

(22) Filed: Jan. 11, 2016

(65) Prior Publication Data

US 2016/0126181 A1     May 5, 2016

Related U.S. Application Data

(63) Continuation of application No. 13/782,213, filed on Mar. 1, 2013, now abandoned.

(51) Int. Cl.
| | |
|---|---|
| H01L 23/48 | (2006.01) |
| H01L 23/52 | (2006.01) |
| H01L 29/40 | (2006.01) |
| H01L 23/528 | (2006.01) |
| H01L 21/768 | (2006.01) |
| H01L 21/285 | (2006.01) |
| H01L 23/532 | (2006.01) |
| H01L 23/522 | (2006.01) |

(52) U.S. Cl.
CPC ...... *H01L 23/528* (2013.01); *H01L 21/28562* (2013.01); *H01L 21/76849* (2013.01); *H01L 21/76877* (2013.01); *H01L 23/5226* (2013.01); *H01L 23/53238* (2013.01); *H01L 23/53266* (2013.01); *H01L 2924/0002* (2013.01)

(58) Field of Classification Search
None
See application file for complete search history.

(56) References Cited

U.S. PATENT DOCUMENTS

| | | |
|---|---|---|
| 4,517,225 A | 5/1985 | Broadbent |
| 4,920,403 A | 4/1990 | Chow et al. |
| 4,954,214 A | 9/1990 | Ho |
| 5,793,112 A | 8/1998 | Hasegawa et al. |
| 6,037,664 A * | 3/2000 | Zhao ............. H01L 21/7681 257/774 |
| 6,110,826 A | 8/2000 | Lou et al. |
| 6,506,677 B1 | 1/2003 | Avanzino et al. |

(Continued)

OTHER PUBLICATIONS

Brown et al.; Selective CVD Tungsten via Plugs for Multilevel Metallization (Research Paper); vol. 32; 1986; pp. 66-69.

*Primary Examiner* — Telly Green
(74) *Attorney, Agent, or Firm* — Wells St. John, P.S.

(57) ABSTRACT

A method of fabricating integrated circuitry includes forming a first conductive line. First elemental tungsten is deposited directly against an elevationally outer surface of the first conductive line selectively relative to any exposed non-conductive material. Dielectric material is formed elevationally over the first conductive line and a via is formed there-through to conductive material of the first conductive line at a location where the first tungsten was deposited. Second elemental tungsten is non-selectively deposited to within the via and electrically couples to the first conductive line. A second conductive line is formed elevationally outward of and electrically coupled to the second tungsten that is within the via.

9 Claims, 3 Drawing Sheets

(56) References Cited

U.S. PATENT DOCUMENTS

| | | |
|---|---|---|
| 6,724,089 B2 | 4/2004 | Trivedi et al. |
| 2004/0124537 A1 | 7/2004 | Takayama et al. |
| 2005/0064098 A1 | 3/2005 | Elers et al. |
| 2014/0210098 A1* | 7/2014 | Jezewski ............... H01L 23/562 257/774 |

* cited by examiner

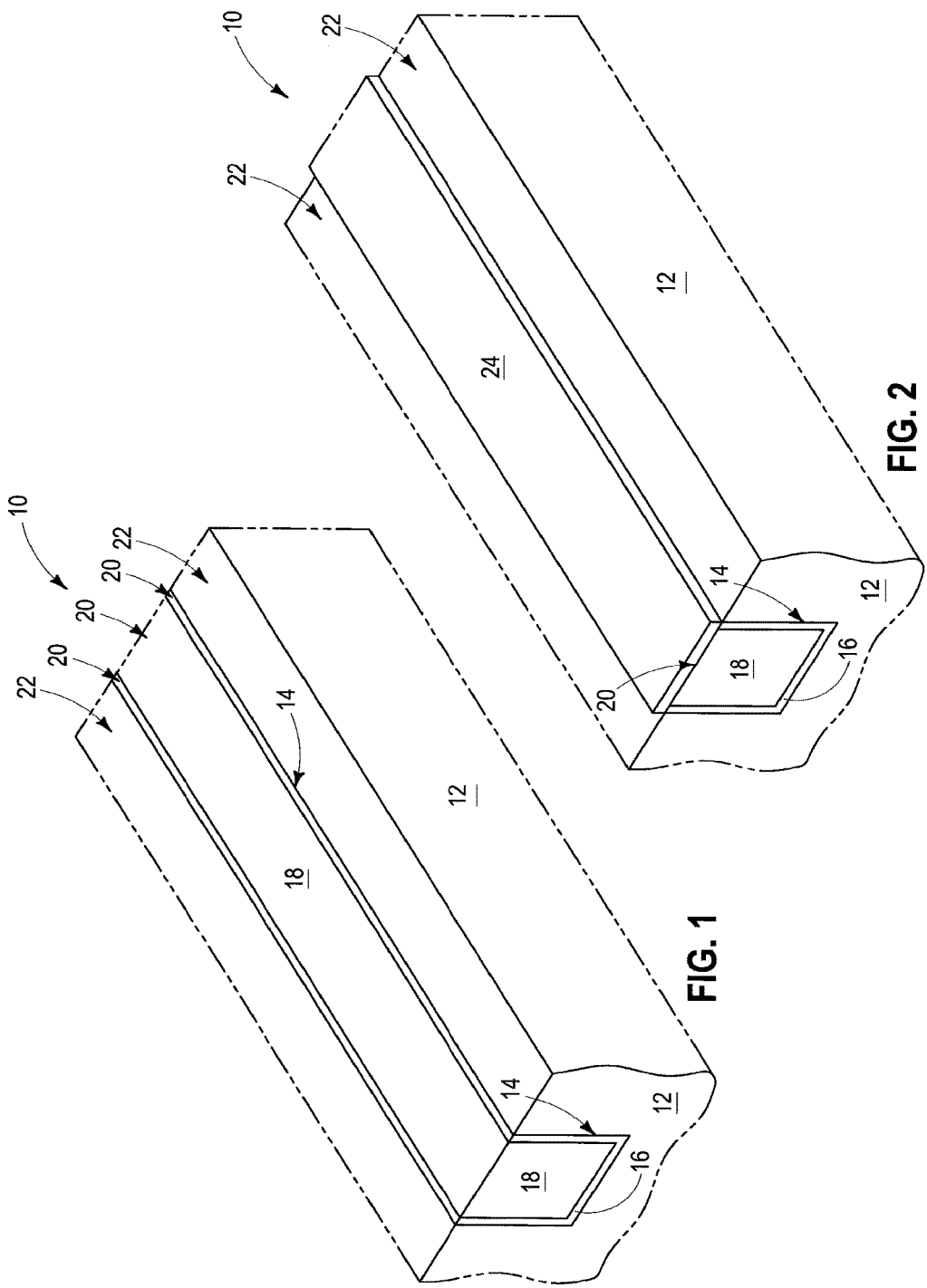

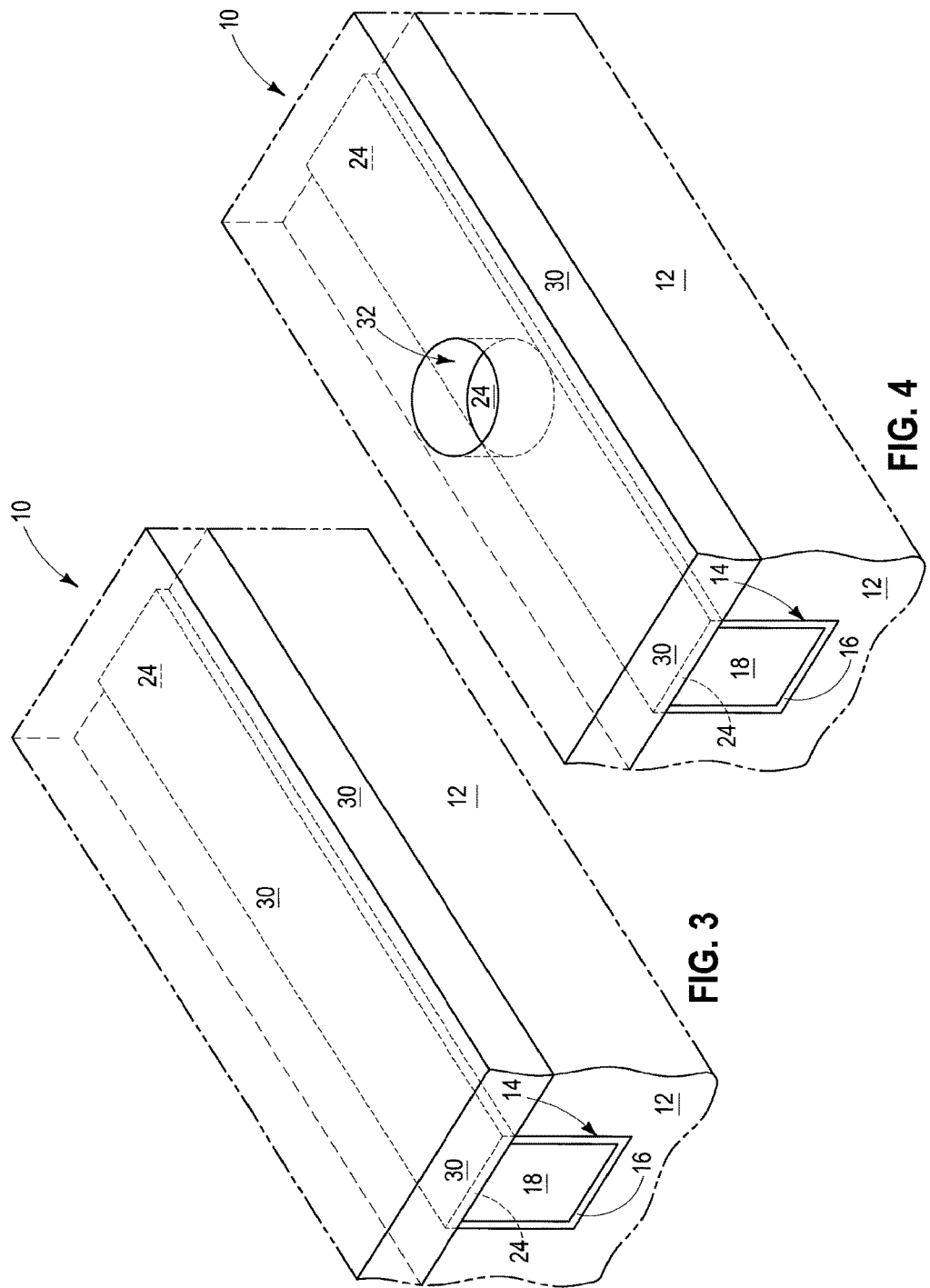

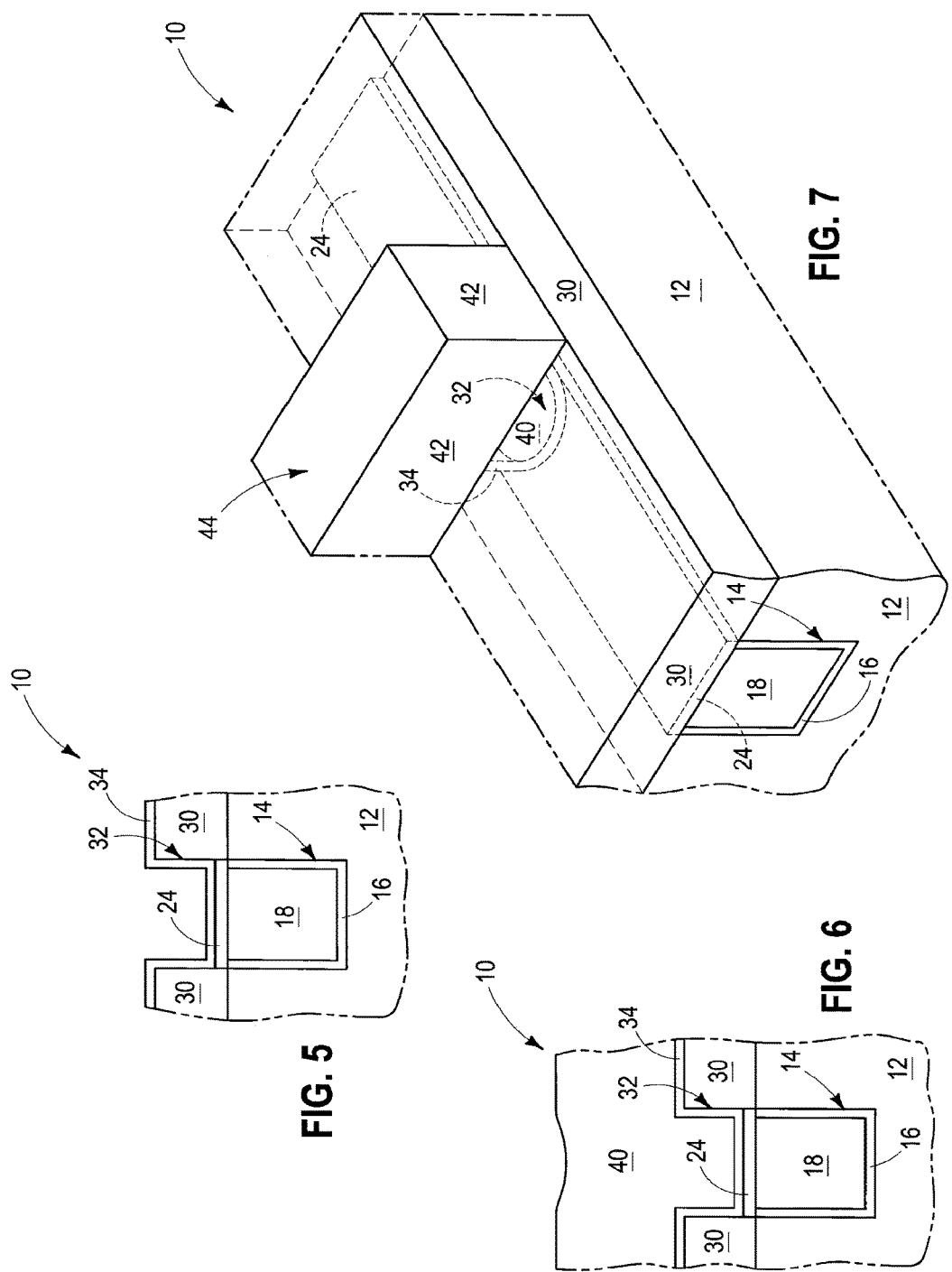

INTEGRATED CIRCUITRY

RELATED PATENT DATA

This patent resulted from a continuation application of U.S. patent application Ser. No. 13/782,213, filed Mar. 1, 2013, entitled "Methods of Fabricating Integrated Circuitry", naming Zailong Bian as inventor, the disclosure of which is incorporated by reference.

TECHNICAL FIELD

Embodiments disclosed herein pertain to methods of fabricating integrated circuitry.

BACKGROUND

Integrated circuitry fabrication continues to make ever smaller features to minimize the size of individual device components and thereby increase density of the components within an integrated circuit. One common component in integrated circuitry is a longitudinally elongated electrically conductive line, for example a global or local interconnect line. Such lines may be formed by subtractive patterning and etch of conductive material. Alternately, a trench having a desired longitudinal outline of the conductive line may be formed in semiconductive or other material. Then, the trench may be wholly or partially filled with conductive material. The conductive material received laterally outward of the trench is then removed. Elemental metals, metal alloys, and conductive metal compounds are commonly used as materials of conductive interconnect lines.

Conductive interconnect lines may be formed at different levels or elevations relative to a substrate. Additionally, those lines at different levels may need to be conductively interconnected. One manner of doing so includes forming dielectric material over lower or inner fabricated interconnect lines. Via openings are then formed there-through to the underlying line or lines, and are subsequently filled with conductive material. Conductive lines are then formed outward of the dielectric material and which electrically couple with the conductive material that is within the via openings.

BRIEF DESCRIPTION OF THE DRAWINGS

FIG. 1 is an isometric view of a substrate in process in accordance with an embodiment of the invention.

FIG. 2 is a view of the FIG. 1 substrate at a processing step subsequent to that shown by FIG. 1.

FIG. 3 is a view of the FIG. 2 substrate at a processing step subsequent to that shown by FIG. 2.

FIG. 4 is a view of the FIG. 3 substrate at a processing step subsequent to that shown by FIG. 3.

FIG. 5 is a cross-sectional view of the FIG. 4 substrate at a processing step subsequent to that shown by FIG. 4.

FIG. 6 is a view of the FIG. 5 substrate at a processing step subsequent to that shown by FIG. 5.

FIG. 7 is an isometric view of the FIG. 6 substrate at a processing step subsequent to that shown by FIG. 6.

DETAILED DESCRIPTION OF EXAMPLE EMBODIMENTS

Example embodiments of methods of fabricating integrated circuitry in accordance with the invention are described with reference to FIGS. 1-7. Referring to FIG. 1, a substrate fragment 10 is shown, and may comprise a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Example substrate 10 comprises dielectric material 12, for example doped silicon dioxide, undoped silicon dioxide, and/or silicon nitride. Any of the materials and/or structures described herein may be homogenous or non-homogenous. Further, each may be formed using any suitable or yet-to-be-developed technique, with atomic layer deposition, chemical vapor deposition, physical vapor deposition, epitaxial growth, diffusion doping, and ion implanting being examples. Other partially or wholly fabricated components of integrated circuitry would likely be elevationally inward of dielectric material 12, and are not particularly germane to the inventions disclosed herein.

A first conductive line 14 has been formed relative to substrate 10. Multiple such lines would likely be fabricated, with only a single line being shown. First conductive line 14 may be formed by any existing or yet-to-be-developed manner, configuration, and/or orientation, with a longitudinally elongated and horizontal orientation and construction being shown. In this document, horizontal refers to a general direction along a primary surface relative to which the substrate is processed during fabrication, and vertical is a direction generally orthogonal thereto. Further, "vertical" and "horizontal" as used herein are generally perpendicular directions relative one another independent of orientation of the substrate in three-dimensional space. Further in this document, "elevational" and "elevationally" are with reference to the vertical direction relative to a base substrate upon which the circuitry has been fabricated.

Conductive line 14 may be fabricated of any suitable conductive material(s). In one embodiment, at least a majority of conductive line 14 comprises, consists essentially of, or consists of one or more of elemental metal(s), alloys of two or more elemental metals, and/or conductive metal compounds. In one embodiment and as shown, first conductive line 14 comprises an exterior lining 16 (e.g., elemental tantalum) surrounding a different composition central and majority material 18 (e.g., elemental copper). As used herein, "different composition" only requires those portions of two stated materials that may be directly against one another to be chemically and/or physically different, for example if such materials are not homogenous. If the two stated materials are not directly against one another, "different composition" only requires that those portions of the two stated materials that are closest to one another be chemically and/or physically different if such materials are not homogenous. In this document, a material or structure is "directly against" another when there is at least some physical touching contact of the stated materials or structures relative one another. In contrast, "over", "on", and "against" not preceded by "directly", encompass "directly against" as well as construction where intervening material(s) or structure(s) result(s) in no physical touching contact of the stated materials or structures relative one another.

Regardless, first conductive line 14 comprises an elevationally outermost surface 20 which in one embodiment comprises copper, and in one embodiment comprises elemental copper. In one embodiment, outermost surface 20 is planar. In one embodiment, dielectric material 12 comprises exposed non-conductive material that is provided laterally of first conductive line 14. In one embodiment, non-conductive material 12 has a planar elevationally outermost surface 22 which in one embodiment is coplanar with planar outermost surface 20 of first conductive line 14.

Referring to FIG. 2, first elemental tungsten 24 has been deposited directly against elevationally outermost surface 20 of first conductive line 14, and thereby comprises a part of the conductive material of first conductive line 14. In one embodiment, first elemental tungsten 24 is deposited directly against a copper-comprising surface of first conductive line 14 along at least a majority of longitudinal length of first conductive line 14. First elemental tungsten 24 may be deposited continuously along first conductive line 14 and along at least a majority of its length, for example as shown. In one embodiment, the first elemental tungsten may be deposited at one or more spaced locations along the line (not shown) as opposed to continuously there-along. Regardless, first elemental tungsten 24 is deposited selectively to first conductive line 14 relative to any, if any, exposed non-conductive material. In the context of this document, selective and selectively requires a deposition of elemental tungsten relative to any, if any, exposed non-conductive material at a deposition rate of at least 5:1, wherein a non-selective deposition is at a ratio less than 5:1. Ideally, any elemental tungsten deposited on non-conductive material is insufficient to cause an interconnected short or to cause undesired leakage. FIG. 2 shows an example embodiment wherein no tungsten deposits on exposed outermost surface 22 of non-conductive material 12. An example total elevational deposition thickness for first tungsten 24 is from about 50 Angstroms to about 500 Angstroms.

In one embodiment, the selective depositing of the first elemental tungsten is by chemical vapor deposition within a deposition chamber using gaseous $WF_6$ and $SiH_4$ as deposition precursors which are fed to the chamber during the deposition. Inert and/or other gases may be fed to the chamber during the deposition. In one embodiment during the deposition, substrate temperature is from about 250° C. to about 350° C., chamber pressure is from about 1 mTorr to about 100 mTorr, $WF_6$ flow rate to the chamber is from about 10 sccm to about 1,000 sccm, and $SiH_4$ flow rate to the chamber is from about 5 sccm to about 50 sccm. An example inert gas flow rate (e.g., Ar) is from 0 sccm to about 1,000 sccm. Flow rates provided herein are ideally to or at the substrate independent of chamber volume.

In one embodiment, the selective depositing of the first elemental tungsten is by chemical vapor deposition within a deposition chamber using gaseous $WF_6$ and $H_2$ as deposition precursors which are fed to the chamber during the deposition. Inert and/or other gases may be fed to the chamber during the deposition. In one embodiment during the deposition, substrate temperature is from about 300° C. to about 450° C., chamber pressure is from about 20 Torr to about 250 Torr, $WF_6$ flow rate to the chamber is from about 100 sccm to about 500 sccm, and $H_2$ flow rate to the chamber is from about 1,000 sccm to about 30,000 sccm. An example inert gas flow rate (e.g., Ar) is from 0 sccm to about 1,000 sccm.

Referring to FIG. 3, dielectric material 30 has been formed elevationally over first conductive line 14, and in one embodiment directly against first tungsten 24 and in one embodiment over and/or directly against non-conductive material 12. Dielectric material 30 may be of the same composition as that of non-conductive material 12 or may be of different composition from that of non-conductive material 12.

Referring to FIG. 4, a via 32 has been formed through dielectric material 30 to conductive material of first conductive line 14 at a location where first tungsten 24 was deposited directly there-against. In one embodiment and as shown, via 32 has been formed through dielectric material 30 to first tungsten 24. Regardless, one or more than one via may be formed to an individual first conductive line 14. An example technique of forming via 32 is by photolithographic patterning followed by subsequent anisotropic etch of dielectric material 30.

Referring to FIG. 5, and in one embodiment, conductive material 34 has been formed directly against first tungsten 24 after forming via 32. In one embodiment, conductive material 34 comprises a liner within and over sidewalls of via 32, is directly against first tungsten 24, and is elevationally over dielectric material 30. Example conductive materials 34 include one or both TiN and WN ideally deposited by at least one of chemical vapor deposition and atomic layer deposition. Another example conductive material 34 is physical vapor deposited elemental tungsten. Regardless, conductive material 34 may comprise, consist essentially of, or consist of at least one of TiN, WN, and physical vapor deposited elemental tungsten.

Referring to FIG. 6, second elemental tungsten 40 has been non-selectively deposited to within via 32 (i.e., at a deposition rate of less than 5:1 within the via versus laterally outward of the via) and electrically couples to first conductive line 14. In one embodiment, the second elemental tungsten is deposited at a deposition rate of about 1:1 within the via versus laterally outward of the via. In one embodiment and as shown, second elemental tungsten 40 is directly against conductive material 34. In one embodiment where conductive material 34 has been deposited in the form of a lining that extends elevationally over dielectric material 30, second tungsten 40 also non-selectively deposits elevationally over that portion of conductive material 34 that is elevationally over dielectric material 30. Second elemental tungsten 40 may be of the same physical composition as first tungsten 24 or may be of different physical composition while still maintaining a common elemental tungsten chemical composition. An example non-selective deposition technique for second elemental tungsten 40 is by chemical vapor deposition within a deposition chamber. A more specific example includes using gaseous $WF_6$ and $H_2$ as deposition precursors fed to the chamber at respective flow rates from about 100 sccm to about 500 sccm and 1,000 sccm to about 30,000 sccm, substrate temperature from about 300° C. to about 450° C., and chamber pressure from about 20 Torr to about 250 Torr. Additional inert and/or reactive gas might also be flowed to the chamber. An example inert gas (e.g., Ar) flow rate is from 0 sccm to about 50,000 sccm. Regardless, FIG. 6 shows an example embodiment wherein second tungsten 40 is not deposited directly against first tungsten 24. Some or all of first tungsten 24 may be removed (not shown), and/or wholly or partially transformed to another conductive material (e.g., a silicide) prior to formation of via 32 (not shown), or after formation of via 32 (not shown) prior to depositing second elemental tungsten 40

A second conductive line is formed elevationally outward of and electrically coupled to the second tungsten that is within the via. Such may occur by a number of manners. For example, conductive materials 34 and 40 of FIG. 6 may be deposited to a suitable desired deposition thickness and thereafter subtractively patterned (e.g., by photolithographic patterning and subsequent etch) to form a desired second conductive line. Alternately, for example as shown in FIG. 7, second tungsten 40 and conductive material liner 34 may be removed back at least to expose dielectric material 30. Thereafter and as shown, conductive material 42 may be deposited directly against second tungsten 40 and liner 34. Conductive material 42 forms a second conductive line 44 which may be of the same or different composition as that of first conductive line 14, and may be formed in the same manner as line 14 or in other manners.

An embodiment of the invention encompasses forming a first conductive line and depositing first elemental tungsten directly against an elevationally outer surface thereof selectively relative to any exposed non-conductive material. In other words, exposed non-conductive material need not be present during the depositing of the first elemental tungsten directly against an elevationally outer surface of first conductive line. Yet if exposed non-conductive material is present, deposition of the first elemental tungsten occurs selectively to the line in comparison to the exposed non-conductive material. Further and regardless, the first elemental tungsten may or may not deposit all along the first conductive line, for example depending on whether all or a portion of elevationally or other outer surfaces thereof are exposed. Regardless, dielectric material is formed elevationally over the first conductive line and regardless of presence of non-conductive material laterally thereof. A via is formed through the dielectric material to conductive material of the first conductive line at a location where the first tungsten was deposited. Such via formation may occur regardless of whether the first tungsten remains as initially deposited, has been wholly or partially removed, or has been replaced or transformed into another conductive material which may or may not comprise tungsten. Regardless, second elemental tungsten is non-selectively deposited to within the via and electrically couples to the first conductive line independent of whether another conductive material has been provided between the second tungsten and the first conductive line. A second conductive line is formed elevationally outward of and electrically couples to the second tungsten which is within the via.

A predecessor process to those in accordance with the invention sputter-deposited (i.e., physical vapor deposited) elemental titanium into a via formed in dielectric material and that extended to a conductive elemental copper-comprising line. That titanium was deposited as a liner, and titanium nitride was sputter-deposited thereover as an additional conductive liner. The titanium enhances interface properties between the titanium nitride and copper, such as improving adhesion between titanium nitride and copper than would otherwise occur in the absence of titanium. Physical vapor deposition of each of titanium and titanium nitride may not achieve desirable step coverage particularly in very small openings and/or in those having high aspect ratios. Further, titanium and titanium nitride are typically physical vapor deposited using elemental titanium targets. An inert gas (e.g., Ar) is typically used as the sputtering source for depositing elemental titanium, and nitrogen gas is used as the sputter source for TiN. If sputter depositing elemental titanium in the same chamber in which titanium nitride is sputter-deposited, the target typically needs to be cleaned after sputter depositing titanium nitride to return the target surface to pure titanium to avoid a subsequent titanium nitride layer from being deposited before sputter depositing titanium. Alternately, two different chambers may be used for depositing titanium and titanium nitride. Regardless, in accordance with one embodiment of the invention, a method of fabricating integrated circuitry relative to a substrate is devoid of depositing elemental titanium directly against elemental copper of the first conductive line.

Physical, chemical, or atomic layer deposition may be used in deposition of conductive materials in accordance with embodiments of the invention, with chemical vapor deposition or atomic layer deposition being ideal.

CONCLUSION

In some embodiments, a method of fabricating integrated circuitry comprises forming a first conductive line. First elemental tungsten is deposited directly against an elevationally outer surface of the first conductive line selectively relative to any exposed non-conductive material. Dielectric material is formed elevationally over the first conductive line and a via is formed there-through to conductive material of the first conductive line at a location where the first tungsten was deposited. Second elemental tungsten is non-selectively deposited to within the via and electrically couples to the first conductive line. A second conductive line is formed elevationally outward of and electrically coupled to the second tungsten that is within the via.

In some embodiments, a method of fabricating integrated circuitry comprises forming a first conductive line having an elevationally outermost surface comprising copper. An exposed non-conductive material is provided laterally of the first conductive line. First elemental tungsten is deposited directly against the copper-comprising surface along at least a majority of longitudinal length of the first conductive line. The first tungsten is deposited selectively to the first conductive line relative to the exposed non-conductive material. Dielectric material is formed elevationally over and directly against the first tungsten and a via is formed through the dielectric material to the first tungsten. A conductive material is formed directly against the first tungsten after forming the via. Second elemental tungsten is non-selectively deposited to within the via directly against the conductive material. A second conductive line is formed elevationally outward of and electrically coupled to the second tungsten that is within the via.

In some embodiments, a method of fabricating integrated circuitry comprises forming a first conductive line having a planar elevationally outermost surface at least a majority of which comprises elemental copper. Non-conductive material is provided laterally of the first conductive line. The non-conductive material has a planar elevationally outermost surface that is coplanar with the planar outermost surface of the first conductive line. First elemental tungsten is deposited directly against the copper-comprising surface along at least a majority of longitudinal length of the first conductive line. The first tungsten is deposited selectively to the first conductive line relative to the coplanar outermost surface of the non-conductive material. Dielectric material is formed elevationally over and directly against the first tungsten and the non-conductive material. A via is formed through the dielectric material to the first tungsten. A conductive material liner is formed within the via over sidewalls of the via, within the via directly against the first tungsten, and elevationally over the dielectric material. Second elemental tungsten is non-selectively deposited to within the via directly against the conductive material liner and elevationally over that portion of the conductive material liner that is elevationally over the dielectric material. A second conductive line is formed elevationally outward of and electrically coupled to the second tungsten that is within the via.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. Integrated circuitry comprising:
   a first dielectric layer;
   a first conductive line within the first dielectric layer, the first dielectric layer having an uppermost surface, the first conductive line comprising a conductive outer lining and a central material of different composition from that of the conductive outer lining, the conductive outer lining and the central material having respective uppermost surfaces that are elevationally coincident with each other and with the uppermost surface of the first dielectric layer;
   a first tungsten layer over and in direct contact with the uppermost surfaces of the conductive outer lining and the central material of the first conductive line, the first tungsten layer being everywhere elevationally outward of the first dielectric layer;
   a second dielectric layer covering the first dielectric layer and the first tungsten layer;
   a via in the second dielectric layer extending to a part of the first tungsten layer, the second dielectric layer including a side surface extending there-through which defines the via;
   a conductive liner layer covering over the part of the first tungsten layer and covering over the side surface of the second dielectric layer and which less-than-fills a central portion of the via;
   a second tungsten layer of different composition from the conductive liner filling the central portion of the via; and
   the conductive liner layer and the second tungsten layer being elongated over the second dielectric layer to form a second conductive line, the conductive liner being between the second tungsten layer and the second dielectric layer in a finished construction of the integrated circuitry.

2. The circuitry of claim 1, wherein the central material of the first conductive line consists essentially of elemental copper.

3. The circuitry of claim 1, wherein the conductive liner layer is in direct contact with the part of the first tungsten layer and with the second tungsten layer.

4. The circuitry of claim 3, wherein the conductive liner layer comprises at least one of the TiN and WN.

5. The circuitry of claim 3 comprising a second conductive line crossing over the first conductive line, the second conductive line being electrically coupled with the conductive liner and the second tungsten layer.

6. The circuitry of claim 5 wherein the second conductive line directly contacts the conductive liner and the second tungsten layer.

7. The circuitry of claim 1 wherein the first tungsten layer is discontinuous being at spaced locations along the first conductive line.

8. The circuitry of claim 1 wherein the conductive liner comprises both of TiN and W.

9. The circuitry of claim 1 wherein the first and second tungsten layers are of the same chemical compositions and of different physical compositions.

* * * * *